US011425814B2

(12) United States Patent
Madhava et al.

(10) Patent No.: US 11,425,814 B2
(45) Date of Patent: Aug. 23, 2022

(54) FLEXIBLE CIRCUIT CARD ASSEMBLY WITH PREFORMED UNDULATIONS FOR SURVEILLANCE SYSTEM HINGE ASSEMBLY

(71) Applicant: Rosemount Aerospace Inc., Burnsville, MN (US)

(72) Inventors: Kirantu Madhava, Bangalore (IN); Nouduri Phani Srinivas, Bangalore (IN); Ramesh Achutha Rao, Karnataka (IN)

(73) Assignee: Rosemount Aerospace Inc., Burnsville, MN (US)

( * ) Notice: Subject to any disclaimer, the term of this patent is extended or adjusted under 35 U.S.C. 154(b) by 0 days.

(21) Appl. No.: 17/248,666

(22) Filed: Feb. 2, 2021

(65) Prior Publication Data

US 2021/0337655 A1    Oct. 28, 2021

(30) Foreign Application Priority Data

Apr. 22, 2020 (IN) .............................. 202041017304

(51) Int. Cl.
*H05K 1/02* (2006.01)
*B64D 45/00* (2006.01)
(Continued)

(52) U.S. Cl.
CPC ............. *H05K 1/028* (2013.01); *B64D 43/00* (2013.01); *B64D 45/0053* (2019.08);
(Continued)

(58) Field of Classification Search
CPC .... H05K 1/0271; H05K 1/028; H05K 1/0393; H05K 1/115; H05K 1/148;
(Continued)

(56) References Cited

U.S. PATENT DOCUMENTS 8,380,080 B2 *  2/2013  Kawaguchi .......... H05K 1/0234
                                                      398/164
9,287,341 B2    3/2016  Cheon et al.
(Continued)

FOREIGN PATENT DOCUMENTS

DE          29504736 U1    7/1995
EP            671788 A1    9/1995
(Continued)

OTHER PUBLICATIONS

Extended European Search Report dated Sep. 24, 2021, for corresponding European Patent Application No. 21169941.8.

*Primary Examiner* — Hoa C Nguyen
*Assistant Examiner* — John B Freal
(74) *Attorney, Agent, or Firm* — Kinney & Lange, P.A.

(57) ABSTRACT

A hinge assembly configured for attachment to two objects is described herein. The hinge assembly includes: a flexible circuit board having planar conductive circuitry and including at least one preformed undulation in a region of the flexible circuit board, wherein the at least one undulation is configured to allow the flexible circuit board to bend at the region; and a plurality of plated-through holes defined by the flexible circuit board, wherein the holes are configured to allow attachment of the flexible circuit board to the two objects, wherein the flexible circuit board is configured to movably and electrically connect the two objects.

20 Claims, 3 Drawing Sheets

(51) Int. Cl.
   *B64D 43/00*    (2006.01)
   *H05K 1/11*     (2006.01)
(52) U.S. Cl.
   CPC ... *H05K 1/115* (2013.01); *H05K 2201/09545* (2013.01); *H05K 2201/10128* (2013.01)
(58) Field of Classification Search
   CPC ......... H05K 2201/05; H05K 2201/058; H05K 2201/09545; H05K 2201/10128; B64D 43/00; B64D 43/0053
   See application file for complete search history.

(56) References Cited

U.S. PATENT DOCUMENTS

| | | | |
|---|---|---|---|
| 10,234,899 B1* | 3/2019 | Brocklesby | G06F 1/1681 |
| 10,455,700 B2 | 10/2019 | Sakurai et al. | |
| 2007/0146975 A1* | 6/2007 | Chen | H05K 1/028 |
| | | | 361/679.02 |
| 2017/0271799 A1 | 9/2017 | Axelowitz et al. | |
| 2020/0060020 A1* | 2/2020 | Park | G06F 1/1618 |
| 2020/0341516 A1* | 10/2020 | Huang | G06F 1/1637 |

FOREIGN PATENT DOCUMENTS

| | | |
|---|---|---|
| EP | 961370 A2 | 12/1999 |
| EP | 1217699 A1 | 6/2002 |
| EP | 1589794 A1 | 10/2005 |
| GB | 2029942 A | 3/1980 |
| WO | 2004030336 A2 | 4/2004 |
| WO | 2019053058 A1 | 3/2019 |

* cited by examiner

FLEXIBLE CIRCUIT CARD ASSEMBLY WITH PREFORMED UNDULATIONS FOR SURVEILLANCE SYSTEM HINGE ASSEMBLY

BACKGROUND

Over time, security has become a subject of increasing concern. One area of particular importance relates to the travel industry which involves processing millions of people on a daily basis. Air travel has received particular scrutiny and is the subject of attempts to greatly increase security measures in order to avoid emergency situations of the type set forth above, resulting in the death of thousands of people.

One area of focus is the ability of the flight and/or cabin crew, as well as other authorized personnel which may be present on the aircraft, to monitor the activities occurring within the passenger cabin (and/or cargo area) of an aircraft. Of particular importance is the ability to allow the flight crew to observe unusual or emergency activities by passengers on board the aircraft. Accordingly, there is a significant need for a surveillance system particularly structured to monitor the activities within predetermined portions of an aircraft such as, but not necessarily limited to, the passenger cabin. An example of such a surveillance system is a cockpit door surveillance system (CDSS) that aids a pilot in monitoring an area outside the cockpit door.

SUMMARY

A hinge assembly configured for attachment to two objects is described herein. The hinge assembly includes: a flexible circuit board having planar conductive circuitry and including at least one preformed undulation in a region of the flexible circuit board, wherein the at least one undulation is configured to allow the flexible circuit board to bend at the region; and a plurality of plated-through holes defined by the flexible circuit board, wherein the holes are configured to allow attachment of the flexible circuit board to the two objects, wherein the flexible circuit board is configured to movably and electrically connect the two objects.

A display assembly is described herein. The display assembly includes: a display unit; and a hinge assembly including: a flexible circuit board having planar conductive circuitry and including at least one preformed undulation in a region of the flexible circuit board, wherein the at least one undulation is configured to allow the flexible circuit board to bend at the region; and a plurality of plated-through holes defined by the flexible circuit board, wherein the holes are configured to allow attachment of the flexible circuit board to the display unit and to a fixed component, wherein the flexible circuit board is configured to movably and electrically connect the display unit and the hinge assembly.

A surveillance system for monitoring activity within an aircraft interior is described herein. The system includes: a viewing assembly disposed within the aircraft interior and structured to monitor at least a predetermined portion thereof; a display assembly disposed within the aircraft interior and electrically connected to the viewing assembly, the display assembly including: a display unit; and a hinge assembly including: a flexible circuit board having planar conductive circuitry and including at least one preformed undulation in a region of the flexible circuit board, wherein the at least one undulation is configured to allow the flexible circuit board to bend at the region; and a plurality of plated-through holes defined by the flexible circuit board, wherein the holes are configured to allow attachment of the flexible circuit board to the display unit and to a fixed component; an activation assembly variably spaced at least in part from the viewing assembly and remotely operative to initiate observation of the aircraft interior; and a control assembly interconnecting the viewing assembly, the display assembly and the activation assembly, wherein the flexible circuit board is configured to movably and electrically connect the display unit to the control assembly.

DETAILED DESCRIPTION

An improved hinge assembly for a surveillance system, such as a surveillance system for an aircraft, is disclosed herein. The surveillance system can be a cockpit door surveillance system (CDSS) that can aid a pilot or other airplane crew member in monitoring an area outside the cockpit door. The CDSS can include, for example, cameras, a central processing unit (CPU), and least one display unit with an attached hinge assembly. The hinge assembly can be configured and arranged to allow swiveling motion of the display unit for the pilot's convenience. The hinge assembly can include a flexible circuit card, or flexible circuit board, that forms an interface to transfer signals from the central processing unit and/or the cameras to the display unit. The flexible circuit card can be subjected to bending, for example, during the swiveling action of the display unit. The hinge assembly disclosed in the present disclosure provides a new design in which the flexible circuit card includes at least one preformed undulation or wave that can improve resistance to fatigue failure of the flexible circuit card. A person of ordinary skill would recognize that other embodiments could be used in other aircraft and non-aircraft applications. Without limiting the broad scope of this disclosure, this disclosure will describe the CDSS embodiment.

Figure 1:
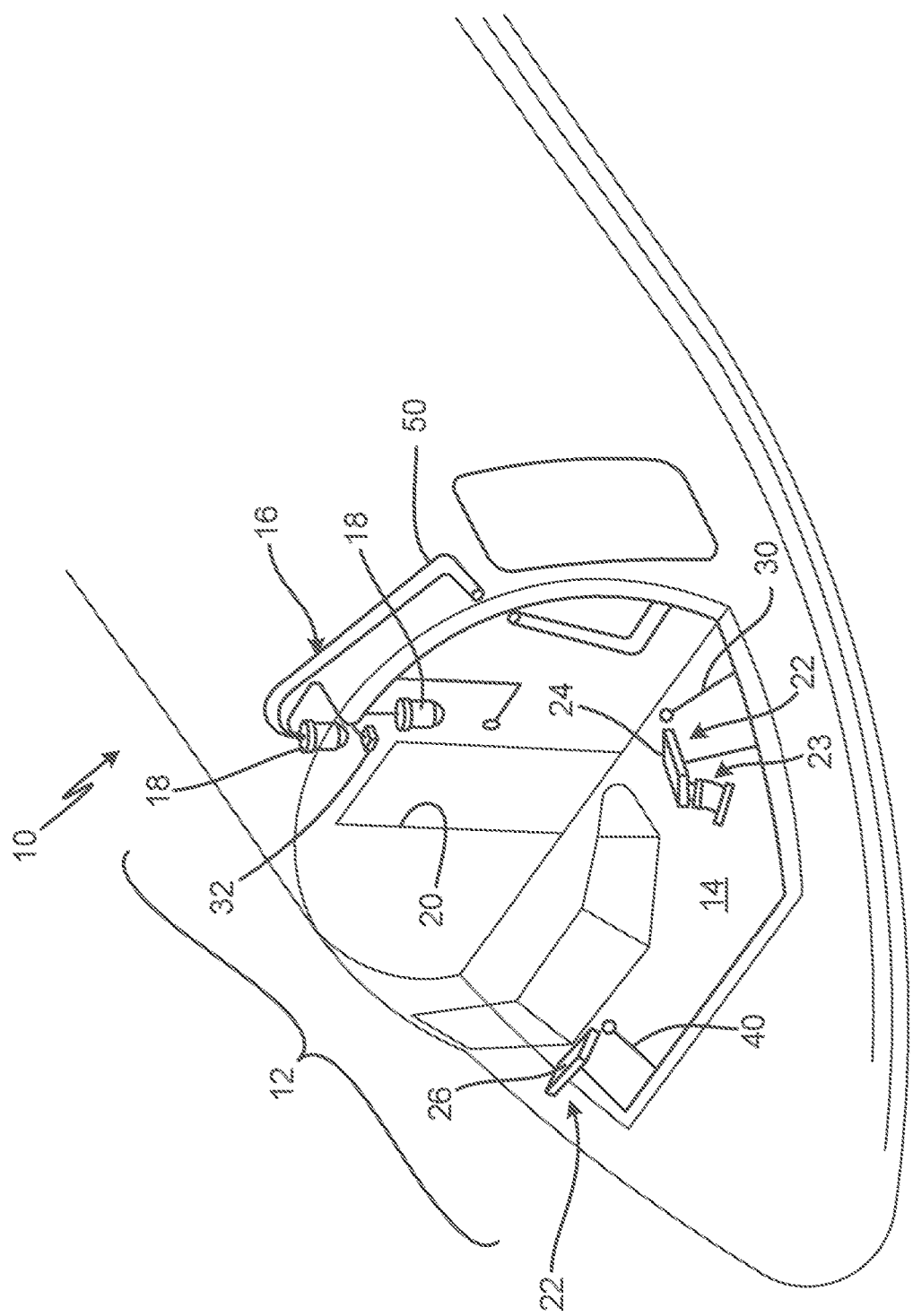
FIG. 1 is a schematic representation in perspective and partial cutaway showing the location of certain operational components of a surveillance system on or within an aircraft in accordance with the present disclosure.

FIG. 1 is a schematic representation in perspective and partial cutaway showing the location of certain operational components of a surveillance system of the present disclosure on or within an aircraft 10. Surveillance system 12 is structured to provide visual monitoring of activities within predetermined portions of a commercial, or other aircraft, such as, for example, an area outside a cockpit door. FIG. 1 further shows an interior view of a cockpit 14 absent certain normal structures and features associated therewith, such as the seats for the flight crew, control panels and other operational equipment. Surveillance system 12 may be adaptable for all commercial and private aircraft including those configured to transport passengers, freight/cargo or both. Accordingly, surveillance system 12 is structured to allow visual observation and monitoring of predetermined portions of the aircraft interior including, but not limited to, an area outside the cockpit door, by the members of the flight crew located within the cockpit 14 without any member of the flight crew having to leave the flight deck or cockpit 14.

Surveillance system 14 comprises viewing assembly 16 and includes at least one but preferably a plurality of cameras 18. As shown in FIG. 1, plurality of cameras 18 are two in number. However, surveillance system 12 may be operative with one such camera 18 or more than two of such cameras 18 located strategically throughout the predetermined portion of the aircraft interior being monitored, such as the passenger cabin, and specifically an area in front of cockpit door 20. As demonstrated in FIG. 1, both cameras 18 may be secured to and depend from ceiling portions of the passenger cabin interior.

In order to facilitate visual observation and image capturing during all flight conditions, each of cameras 18 may be specifically designed for aircraft application. As such each camera 18 may include a light sensor assembly (not shown) that senses and triggers an infrared source such as a light emitting diode (LED), for example. The light sensor assembly may be further structured to convey image data in the form of captured images to the flight crew, within cockpit 14.

Surveillance system 12 comprises display assembly 22 including at least one but preferably a plurality of monitors 24 and 26 disposed within cockpit 14 in clear view of all or particular members of the flight crew. Display monitor 24 may be located adjacent the position of a captain/pilot such that observation and access to display monitor 24 is present. Similarly, display monitor 26 may be located in accessible, observable relation to a first officer/co-pilot. A single display monitor can be located within the cockpit 14 or alternatively a number of such display monitors 24 or 26 greater than two, dependent upon the size, configuration, etc. of cockpit 14 and/or the number of individuals associated with the flight crew. Display monitors 24 and 26, for example, may display a real-time or frame image of an area within the cabin of the aircraft 10 as captured by cameras 18, for example. Display assembly 22 may be hingedly connected or moveably coupled to a wall, desk or other structure in the cockpit 14 using a hinge assembly 23.

Each of display monitors 24 and 26 includes a display screen (not shown in FIG. 1), which may be in the form of a liquid crystal display (LCD) or other appropriate structure capable of projecting images thereon in both black and white and color. Each of display monitors 24 and 26 includes operational controls, such as, for example, brightness control, contrast control and color control. It should be apparent that a greater or lesser number of such controls may be provided.

Yet another feature of surveillance system 12 includes activation assembly 30. Activation assembly 30 (shown in FIG. 1 in cockpit 14, but capable of being located throughout aircraft 10) may be operational to be controlled by the one or more members of the flight crew and/or cabin crew. As such, activation assembly 30 is operative to selectively activate one or more cameras 18 of viewing assembly 16 and concurrently alert members of the flight crew, located within cockpit 14 that emergency or other activities within aircraft 10 should be visually monitored.

Activation assembly 30 may include at least one receiver 32 located at any one of a plurality of appropriate locations throughout aircraft 10 such as, but not limited to, a position adjacent camera 18 of viewing assembly 16. Receiver 32 may be structured to be responsive, by means of wireless communication with at least one but preferably a plurality of transmitters (not shown). The plurality of transmitters may generate and communicate, through wireless transmission, an activation signal to receiver 32. The transmitters may activate cameras 18 and/or an alert assembly generally indicated as 40 located within cockpit 14 of aircraft 10. With reference to alert assembly 40, at least one signal device such as a signal light and/or sounding device may be mounted thereon so as to be clearly observable and/or in communication with at least one, but preferably all of the numbers of the flight crew occupying cockpit 14. In operation the occurrence of an emergency event worthy of being monitored by the flight crew within cockpit 14 will determine activation of surveillance system 12 of as one or more individuals of the flight and/or cabin crew manually depress, or otherwise manipulate, activation assembly 30. Depressing an activation button for at least one second may cause an activation signal to be transmitted to receiver 32. Receiver 32 is connected by control assembly 50 to other operative components and assemblies defining surveillance system 12. More specifically, control assembly 50 may include electrical conduit or other appropriate electrical harness structures, and may be preferably mounted on interior, non-observable portions of the airframe of aircraft 10. Accordingly, control assembly 50 serves to interconnect the various operative components, as set forth herein, of viewing assembly 16, activation assembly 30, display assembly 22, hinge assembly 23, and alert assembly 40. Control assembly 50, activation assembly 30 and other operative components associated with the remainder of surveillance system 12 may be structured to be operationally isolated from the critical flight systems of aircraft 10 so as to not interfere with operation therewith during flight or other performance of aircraft 10. An interface computer (not shown) can also be included in surveillance system 12.

It should be noted that the structural and operational features of all of the components and assemblies, particularly including activation assembly 30 and control assembly 50, are structured to be operationally isolated, meaning that their activation, operation, etc. will not interfere with the critical flight system associated with operation and performance of aircraft 10.

Figure 2:
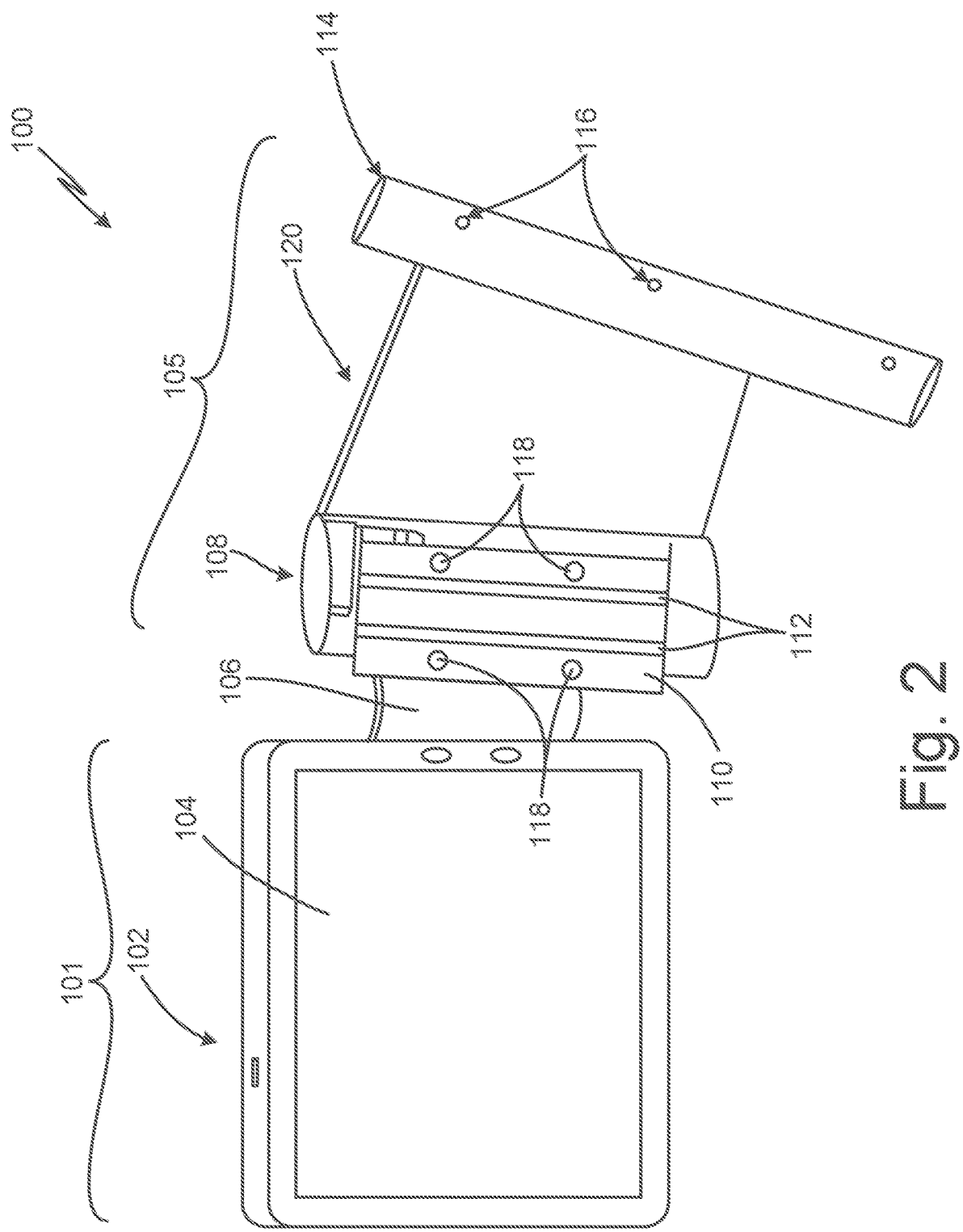
FIG. 2 is a schematic representation in perspective and partial cutaway showing a display assembly in accordance with the present disclosure.

FIG. 2 is a schematic representation in perspective and partial cutaway showing a display assembly 100, including display unit 101 and a hinge assembly 105, and flexible circuit card assembly 110, in accordance with the present disclosure that may be included in a surveillance system of the present disclosure. Display unit 101 can be movably and/or hingedly connected to a wall or desk or other structure or object (not shown). Display unit 101 can include display monitor 102, which includes display screen 104 for viewing real-time or frame images transmitted from cameras (such as cameras 18 in FIG. 1). Display monitor 102 can be any suitable viewing panel, which is capable of displaying real-time or frame images transferred from cameras and/or a computer processing unit (CPU).

Hinge assembly 105 can be connected to display unit 101 and can be used to position and/or adjust display unit 101 with respect to a user such as, for example, a pilot, in order to enhance user comfort, efficiency and effectiveness. Hinge assembly 105 can attach or connect to display unit 101 at display mount 106 using a pivot or joint. Hinge assembly 105 can include pivot, or rotatable, joint 108 in order to allow a swiveling motion of the display unit 101 for the pilot's convenience. Hinge assembly 105 can include any suitable pivot or joint to pivotably or rotatably connect to display unit 101

Flexible circuit card assembly 110, described in more detail below, can be at least partially housed or enclosed in pivot joint 108, and can be connected on one side to display mount 106 and on an opposite side can be connected to hinge assembly 105, for example, using suitable fasteners at fastener locations 118. Flexible circuit card assembly 110 forms an interface to transfer signals from a CPU, for example, through hinge assembly 105 and to display unit 101.

Hinge assembly 105 can also include hinge plate 120 that can be connected to pivot joint 108 on one side and to wall bracket 114 on an opposite side. Wall bracket 114 can include openings 116 for stationary attachment, using a fastener, to a wall, desk or other structure.

Flexible circuit card assembly 110 can include a flexible base material and a conductive coating or cladding. Exemplary materials for the flexible base material can include thermoplastic, thermoset, polyamide, polyester, polyethylene naphthalate, fluorinated ethylene-propylene copolymer, polyetheride, aramid, and epoxy. Exemplary conductive coating or cladding materials includes copper foil, electrodeposited copper, rolled and annealed copper, specialty copper alloys, electroplated copper, sputtered or vapor deposited copper, beryllium copper, aluminum foil, iron alloy, or polymer thick film. A coverlay/insulation layer can be laminated over a copper coating or layer by pressing under heat, pressure and vacuum to ensure proper adhesion. Autoclave may be used. A mold having a wave design may be used, to introduce undulations or waves, during the pressing step. The flexible circuit card assembly 110 can be pre-baked at about 120 degrees Celsius, with a duration of the pre-bake depending upon a layer count in the flexible circuit card assembly 110. The invention, however, is not limited to any of the materials or the provided method of fabricating the flexible circuit card assembly 110 as disclosed herein.

Flexible circuit card assembly 110 is configured and arranged to allow display unit 100 to be movably and/or hingedly connected to a wall or some other structure, and still allow a signal interface between a remote CPU, for example, through hinge assembly 105 and to display unit 101. Flexible circuit card assembly 110 includes at least one preformed undulation 112 or wave in a bend region 124, which can provide localized stress relief in bend region 124 (otherwise known as stress relief region) to reduce fatigue of flexible circuit hinge assembly 110 that can result from overuse or repeated flexing.

Figure 3:
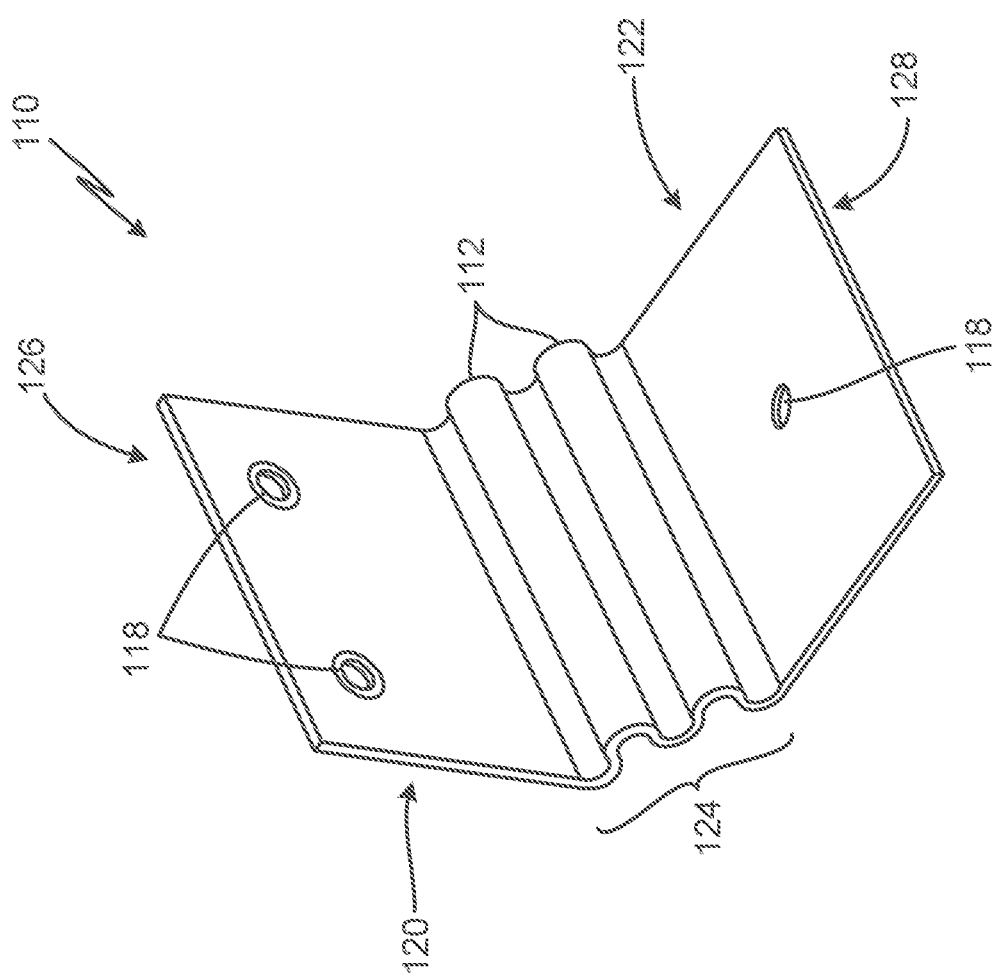
FIG. 3 is a schematic representation in perspective showing a flexible circuit card assembly in a bent configuration in accordance with the present disclosure.

FIG. 3 is a schematic representation in perspective of a flexible circuit card hinge 110 of the present disclosure, shown with a bend. Flexible circuit card assembly 110 can be configured and arranged to improve fatigue life. Flexible circuit card assemblies, when subjected to repeated bending loads, for example, can experience stress due to concave-convex transitions during repeated bending operations. One or more undulations 112 or waves can absorb bending stress. Flexible circuit card assembly 110 can have a uniform or generally uniform thickness. Flexible circuit card assembly 110 in FIGS. 2 and 3 is shown with two undulations 112 or waves. Other numbers of undulations 112, or bend regions 124 including undulations 112, are also contemplated. Undulations 112 are configured and arranged to allow flexibility at the region of the flexible circuit card assembly 110 including undulations 112 rather than inducing high stresses at fastener locations 118. At least one undulation 112 can be located or arranged symmetric about a neutral line of bending region 124 of flexible circuit card assembly 110.

The size of undulations 112 can depend upon the material composition and thickness of flexible circuit card assembly 110. As an example, if a bend radius of a flexible circuit card (with no undulations) is "R," fatigue life of flexible circuit card assembly 110 can be increased by including undulations 112. The presence of more than two undulations 112, for example, in bend region 124, can result in the bend radii of undulations 112 being approximately 0.3 R to approximately 0.6 R.

Fastener locations 118 (or plated-through holes) in flexible circuit card assembly 110 can have any suitable location or be present in any suitable number. Three fastener locations 118 are shown in FIG. 3. Fastener locations 118 are not visible in FIG. 2 but are used to fasten flexible card circuit assembly 110 to rotatable component 107 at one end and wall bracket 114 at another, opposite end. FIG. 3 shows fastener locations 118 near a first end 126 of flexible circuit card assembly 110 and one fastener location 118 near a second end 128 of flexible circuit card assembly 110. Suitable fasteners can be used in fastener locations 118 to attach flexible circuit card assembly 110 to display unit 100 and wall bracket 114, for example.

Flexible circuit card assembly 110 includes signal traces (not shown). The signal traces allow an electrical signal from an interface computer, for example, to be transferred to display unit 100. Bending stress on such signal traces can result in failure of flexible circuit card assembly 110. Undulations 112 reduce stress on the signal traces in flexible circuit card assembly 110.

Static analysis was performed on one exemplary flexible circuit card assembly 110, as shown in FIG. 3. Flexible circuit card assembly 110 was made of three layers of polyimide attached with acrylic adhesive and having a total thickness of about 0.05 inch (1.27 mm), as shown in bent configuration in FIG. 3. Two preformed undulations 112 were formed in bend region 124, each undulation 112 having a radius as indicated of 0.075 inch (1.905 mm).

Vertical face 120 was oriented about 90 degrees from, or perpendicular to, horizontal face 122. Vertical face 120 was 1.33 inches (33.78 mm) in length from bend region 124 to vertical edge 126. Vertical edge had a width of 2.0 inches (50.8 mm). Fastener locations (or holes) 118 on vertical face 120 were located 0.389 inch (9.88 mm) from vertical edge 126 and were used to constrain vertical face 120 during static analysis.

Horizontal face 122 was 1.33 inches (33.78 mm) in length from bend region 124 to horizontal edge 128 and fastener location (or hole) 118 was located 0.665 inch (16.89 mm) from horizontal edge 128. Horizontal edge had a width of 2.0 inches (50.8 mm). The diameter of fastener location 118 in horizontal face 122 was 0.0176 inch (0.447 mm). During static analysis, horizontal face 122 was loaded, such that flexible circuit card assembly 110 deformed at bend region 124.

For complete reversible loading, the maximum principal stress at bend region 124 was measured at 0.62 ksi for flexible circuit card assembly 110 as shown in FIGS. 2 and 3, including undulations 112. Without the undulations 112, and with a bend such as that in FIG. 3, the maximum principal stress was measured at 0.84 ksi. The maximum principal stress was found to be 26.2% lower for the flexible circuit card assembly design shown in FIGS. 2 and 3 compared to a flexible circuit card (or flexible circuit board) that was generally planar in configuration (before being bent) and that did not include preformed undulations or waves. We believe that such a reduction in stress is directly attributable to the incorporation of undulations 112 in the design and that similar benefits would be observed regardless of the materials used to construct a similar hinge, or flexible circuit card assembly.

Discussion of Possible Embodiments

The following are non-exclusive descriptions of possible embodiments of the present invention.

A hinge assembly configured for attachment to two objects may include: a flexible circuit board having planar conductive circuitry and including at least one preformed undulation in a region of the flexible circuit board, wherein the at least one undulation is configured to allow the flexible circuit board to bend at the region; and a plurality of plated-through holes defined by the flexible circuit board, wherein the holes are configured to allow attachment of the flexible circuit board to the two objects, wherein the flexible circuit board is configured to movably and electrically connect the two objects.

The assembly of the preceding paragraph can optionally include, additionally and/or alternatively, any one or more of the following features, configurations and/or additional components:

The at least one preformed undulation in the region may form a stress relief region in the flexible circuit board configured to reduce stress induced when bending the flexible circuit board.

The at least one preformed undulation may be located between at least one of the plurality of plated-through holes located near a first end of the hinge assembly and at least one of the plurality of plated-through holes located near a second end of the hinge assembly.

The at least one preformed undulation may be configured and arranged to allow flexibility at the region of the flexible circuit board including undulations rather than inducing high stresses at areas including the plurality of plated-through holes.

The flexible circuit board may include a flexible base material and a conductive coating.

The flexible circuit board may include at least two undulations.

A display assembly may include: a display unit; and a hinge assembly including: a flexible circuit board having planar conductive circuitry and including at least one preformed undulation in a region of the flexible circuit board, wherein the at least one undulation is configured to allow the flexible circuit board to bend at the region; and a plurality of plated-through holes defined by the flexible circuit board, wherein the holes are configured to allow attachment of the flexible circuit board to the display unit and to a fixed component, wherein the flexible circuit board is configured to movably and electrically connect the display unit and the hinge assembly.

The assembly of the preceding paragraph can optionally include, additionally and/or alternatively, any one or more of the following features, configurations and/or additional components:

The at least one preformed undulation in the region may form a stress relief region in the flexible circuit board configured to reduce stress induced when bending the flexible circuit board.

The assembly may further include a rotatable component between the display unit and the hinge assembly and configured to allow the display unit to pivot with respect to the flexible circuit board and the fixed component.

The flexible circuit board may be configured to electrically connect the display unit, the hinge assembly and a remote computer processing unit.

The at least one preformed undulation may be located between at least one of the plurality of plated-through holes located near a first end of the hinge assembly and at least one of the plurality of plated-through holes located near a second end of the hinge assembly.

The at least one preformed undulation may be configured and arranged to allow flexibility at the region of the flexible circuit board including undulations rather than inducing high stresses at areas including the plurality of plated-through holes.

The flexible circuit board may include a flexible base material and a conductive coating.

The flexible circuit board may include at least two undulations.

A surveillance system for monitoring activity within an aircraft interior is described herein. The system includes: a viewing assembly disposed within the aircraft interior and structured to monitor at least a predetermined portion thereof; a display assembly disposed within the aircraft interior and electrically connected to the viewing assembly, the display assembly including: a display unit; and a hinge assembly including: a flexible circuit board having planar conductive circuitry and including at least one preformed undulation in a region of the flexible circuit board, wherein the at least one undulation is configured to allow the flexible circuit board to bend at the region; and a plurality of plated-through holes defined by the flexible circuit board, wherein the holes are configured to allow attachment of the flexible circuit board to the display unit and to a fixed component; an activation assembly variably spaced at least in part from the viewing assembly and remotely operative to initiate observation of the aircraft interior; and a control assembly interconnecting the viewing assembly, the display assembly and the activation assembly, wherein the flexible circuit board is configured to movably and electrically connect the display unit to the control assembly.

The system of the preceding paragraph can optionally include, additionally and/or alternatively, any one or more of the following features, configurations and/or additional components:

The at least one preformed undulation in the region may form a stress relief region in the flexible circuit board configured to reduce stress induced when bending the flexible circuit board.

The at least one preformed undulation may be located between at least one of the plurality of plated-through holes located near a first end of the hinge assembly and at least one of the plurality of plated-through holes located near a second end of the hinge assembly.

The at least one preformed undulation may be configured and arranged to allow flexibility at the region of the flexible circuit board including undulations rather than inducing high stresses at areas including the plurality of plated-through holes.

The flexible circuit board may include a flexible base material and a conductive coating.

The flexible circuit board may include at least two undulations.

While the invention has been described with reference to an exemplary embodiment(s), it will be understood by those skilled in the art that various changes may be made and equivalents may be substituted for elements thereof without departing from the scope of the invention. In addition, many modifications may be made to adapt a situation or material to the teachings of the invention without departing from the essential scope thereof. Therefore, it is intended that the invention not be limited to the embodiment(s) disclosed, but that the invention will include all embodiments falling within the scope of the appended claims.

The invention claimed is:

1. A hinge assembly, configured for attachment to two objects, comprising:
    a flexible circuit board having planar conductive circuitry and including at least one preformed undulation in a region of the flexible circuit board, wherein the at least one undulation is configured to allow the flexible circuit board to bend at the region, and wherein the at least one preformed undulation comprises:
a first concave region;
a second concave region; and
a first convex region between the first concave region and the second concave region, wherein the first concave region, the first convex region, and the second concave region form a wave profile in the region; and
a plurality of plated-through holes defined by the flexible circuit board, wherein the holes are configured to al attachment of the flexible circuit board to the two objects,
wherein the flexible circuit board is configured to movably and electrically connect the two objects.

2. The hinge assembly of claim 1, wherein the at least one preformed undulation in the region forms a stress relief region in the flexible circuit board configured to reduce stress induced when bending the flexible circuit hoard.

3. The hinge assembly of claim 1, wherein the at least one preformed undulation is located between at least one of the plurality of plated-through holes located near a first end of the hinge assembly and at least one of the plurality of plated-through holes located near a second end of the hinge assembly.

4. The hinge assembly of claim 1, wherein the at least one preformed undulation is configured and arranged to allow flexibility at the region of the flexible circuit board including undulations rather than inducing high stresses at areas including the plurality of plated-through holes.

5. The hinge assembly of claim 1, wherein the flexible circuit board includes a flexible base material and a conductive coating.

6. The hinge assembly of claim 1, wherein the flexible circuit board includes at least two undulations.

7. A surveillance system for monitoring activity within an aircraft interior, said system comprising:
a viewing assembly disposed within the aircraft interior and structured to monitor at least a predetermined portion thereof;
a display assembly disposed within the aircraft interior and electrically connected to the viewing assembly, the display assembly including:
a display unit; and
the hinge assembly of claim 1: and
a plurality of plated-through holes defined by the flexible circuit board, wherein the holes are configured to allow attachment of the flexible circuit board to the display unit and to a fixed component;
an activation assembly variably spaced at least in part from the viewing assembly and remotely operative to initiate observation of the aircraft interior; and
a control assembly interconnecting the viewing assembly, the display assembly and the activation assembly,
wherein the flexible circuit board is configured to movably and electrically connect the display unit to the control assembly.

8. The system of claim 7, wherein the at least one preformed undulation in the region forms a stress relief region in the flexible circuit board configured to reduce stress induced when bending the flexible circuit board.

9. The system of claim 7, Wherein the at least one preformed undulation is located between at least one of the plurality of plated-through holes located near a first end of the hinge assembly and at least one of the plurality of plated-through holes located near a second end of the hinge assembly.

10. The system of claim 7, wherein the at least one preformed undulation is configured and arranged to allow flexibility at the region of the flexible circuit board including undulations rather than inducing high stresses at areas including the plurality of plated-through holes.

11. The system of claim 7, wherein the flexible circuit board includes a flexible base material and a conductive coating.

12. The system of claim 7, wherein the flexible circuit board includes at least two undulations.

13. A display assembly comprising:
a display unit; and
a hinge assembly including:
a flexible circuit board having planar conductive circuitry and including at least one preformed undulation in a region of the flexible circuit board, wherein the at least one undulation is configured to allow the flexible circuit hoard to bend at the region, and wherein the at least one preformed undulation comprises:
a first curved concave region;
a second curved concave region; and
a first curved convex region between the first curved concave region and the second curved concave region, wherein the first curved concave region, the first curved convex region, and the second curved concave region form a wave profile in the region; and
a plurality of plated-through holes defined by the flexible circuit board, wherein the holes are configured to allow attachment of the flexible circuit board to the display unit and to a fixed component,
wherein the flexible circuit board is configured to movably and electrically connect the display unit and the hinge assembly.

14. The display assembly of claim 13, wherein the at least one preformed undulation in the region forms a stress relief region in the flexible circuit board configured to reduce stress induced when bending the flexible circuit board.

15. The display assembly of claim 13, further comprising:
a rotatable component between the display unit and the hinge assembly and configured to allow the display unit to pivot with respect to the flexible circuit board and the fixed component.

16. The display assembly of claim 13, wherein the flexible circuit board is configured to electrically connect the display unit, the hinge assembly and a remote computer processing unit.

17. The display assembly of claim 13, wherein the at least one preformed undulation is located between at least one of the plurality of plated-through holes located near a first end of the hinge assembly and at least one of the plurality of plated-through holes located near a second end of the hinge assembly.

18. The display assembly of claim 13, wherein the at least one preformed undulation is configured and arranged to allow flexibility at the region of the flexible circuit board including undulations rather than inducing high stresses at areas including the plurality of plated-through holes.

19. The display assembly of claim 13, wherein the flexible circuit board includes a flexible base material and a conductive coating.

20. The display assembly of claim 13, wherein the flexible circuit board includes at least two undulations.

\* \* \* \* \*

UNITED STATES PATENT AND TRADEMARK OFFICE
CERTIFICATE OF CORRECTION

| | |
|---|---|
| PATENT NO. | : 11,425,814 B2 |
| APPLICATION NO. | : 17/248666 |
| DATED | : August 23, 2022 |
| INVENTOR(S) | : Kirantu Madhava, Nouduri Phani Srinivas and Ramesh Achutha Rao |

Page 1 of 1

It is certified that error appears in the above-identified patent and that said Letters Patent is hereby corrected as shown below:

In the Claims

Column 9, Line 14:
Delete "al"
Insert --allow--

Column 9, Line 22:
Delete "hoard"
Insert --board--

Signed and Sealed this
Fourth Day of October, 2022

Katherine Kelly Vidal
*Director of the United States Patent and Trademark Office*